United States Patent
Trupke

(10) Patent No.: US 10,558,173 B2
(45) Date of Patent: Feb. 11, 2020

(54) METHOD AND DEVICE FOR PRODUCING A REFERENCE FREQUENCY

(71) Applicant: Technische Universität Wien, Vienna (AT)

(72) Inventor: Michael Trupke, Vienna (AT)

(73) Assignee: Technisch Universität Wien, Vienna (AT)

( * ) Notice: Subject to any disclaimer, the term of this patent is extended or adjusted under 35 U.S.C. 154(b) by 0 days.

(21) Appl. No.: 16/091,333

(22) PCT Filed: Apr. 5, 2017

(86) PCT No.: PCT/AT2017/060084
§ 371 (c)(1),
(2) Date: Apr. 12, 2019

(87) PCT Pub. No.: WO2017/173472
PCT Pub. Date: Oct. 12, 2017

(65) Prior Publication Data
US 2019/0235446 A1      Aug. 1, 2019

(30) Foreign Application Priority Data
Apr. 6, 2016   (AT) .............................. A 50282/2016

(51) Int. Cl.
*G04G 3/04*  (2006.01)
*G02B 6/293*  (2006.01)
(Continued)

(52) U.S. Cl.
CPC ........... *G04G 3/04* (2013.01); *G02B 6/29338* (2013.01); *G02B 6/29341* (2013.01);
(Continued)

(58) Field of Classification Search
CPC ............ G02B 6/29338; G02B 6/29331; G02B 6/29341; G02B 6/29358; G02B 6/42;
(Continued)

(56) References Cited

U.S. PATENT DOCUMENTS 3,826,931  A      7/1974  Hammond
8,804,231  B2 *   8/2014  Savchenkov ......... H01S 5/0687
                                                   359/337.1

(Continued)

FOREIGN PATENT DOCUMENTS

WO      20170173472 A1    10/2017

OTHER PUBLICATIONS

English translation of International Search Report of PCT/AT2017/060084 filed May 4, 2017, 3 pages, dated Jul. 24, 2017.
(Continued)

*Primary Examiner* — Michael P Mooney
(74) *Attorney, Agent, or Firm* — McKee, Voorhees & Sease, PLC

(57) ABSTRACT

The invention relates to a method for producing a reference frequency Δf. According to the invention, the use of a first optical resonator (3a; 24) and of a second optical resonator (25) is provided, wherein the first resonator (3a; 24) has a first resonator mode having a first frequency f1 and the second resonator (25) has a second resonator mode having a second frequency f2, wherein the frequencies of the two resonator modes are functions of an operating parameter BP and assume the values f1 and f2 at a specified value $BP_0$ of the operating parameter such that $f1(BP_0)=f1$ and $f2(BP_0)=f2$ apply, wherein the resonators (3a; 24, 25) are designed in such a way that the respective first derivatives of the frequencies f1(BP), f2(BP) with respect to BP or at least respective difference quotients around $BP_0$ correspond within a deviation of at most ±0.1%, wherein light of the first
(Continued)

frequency f1 is stabilized to the first frequency f1 by means of the first resonator and light of the second frequency f2 is stabilized to the second frequency f2 by means of the second resonator, and wherein the difference between the stabilized frequencies f1 and f2, $\Delta f=|f1-f2|$, is determined in order to obtain the stabilized reference frequency $\Delta f$.

32 Claims, 7 Drawing Sheets

(51) Int. Cl.
| | |
|---|---|
| G02B 6/42 | (2006.01) |
| G04F 5/14 | (2006.01) |
| H03L 7/26 | (2006.01) |
| H01S 3/10 | (2006.01) |
| H01S 3/13 | (2006.01) |

(52) U.S. Cl.
CPC ........... *G02B 6/29358* (2013.01); *G02B 6/42* (2013.01); *G02B 6/4215* (2013.01); *H01S 3/10* (2013.01); *H01S 3/13* (2013.01); *G04F 5/14* (2013.01); *H03L 7/26* (2013.01)

(58) Field of Classification Search
CPC .......... G02B 6/4215; G04G 3/04; G04F 5/14; H03L 7/26; H01S 3/10; H01S 3/13; H01S 3/139

USPC .................. 385/14, 24, 27, 28, 30, 129–132
See application file for complete search history.

(56) References Cited

U.S. PATENT DOCUMENTS

2010/0260453 A1* 10/2010 Block ................ G02B 6/12007
                                                        385/24
2012/0320449 A1    12/2012 Savchenkov et al.

OTHER PUBLICATIONS

International Written Opinion in PCT/AT2017/060084, filed Apr. 5, 2017, dated 2017.
Austria Patent Office Search Report, dated Apr. 4, 2016.
Drever, R.W.P., "Laser Phase and Frequency Stabilization Using an Optical Resonator", Applied Physics B, 31, pp. 97-105, Feb. 10, 1983.
Oates et al., An ALI-Diode-Laser Optical Frequency Reference Using Laser-Trapped Calcium, IEE Intl. Frequency Control Symposium, 6 pages, 1997.
Rutzel, Thomas, Conceptual Design and Setup of a Highly Stable Laser for Precision Measurements on Ultracold Quantum Gases, University Hamburg, Dept Physik, 105 pages, Jan. 2010.

* cited by examiner

METHOD AND DEVICE FOR PRODUCING A REFERENCE FREQUENCY

CROSS-REFERENCE TO RELATED APPLICATION

This application claims benefit under 35 U.S.C. § 119 or § 120 to Austrian application Serial No. A 50282/2016 filed Jun. 4, 2016, herein incorporated by reference in its entirety.

FIELD OF THE INVENTION

This invention concerns a method for producing a reference frequency.

This invention also concerns a device for producing a reference frequency.

BACKGROUND OF THE INVENTION

Frequency references or their production are known in various forms. One may mention as examples quartz oscillators, microwave transitions in atomic ground states (rubidium oven, cesium reference, hydrogen maser), and optical transitions in atoms (strontium) or ions (aluminum). For reasons of cost, mainly quartz oscillators are used in everyday applications, while atomic references are used where higher accuracies are necessary, for example in scientific, military, or communications fields. Important applications, besides the timekeeping itself, are navigation by means of satellite signals (for example GPS) or direct navigation by means of acceleration measurement, as well as network synchronization and frequency allocation for communications channels in radio, satellite, or cellular networks.

Quartz oscillators are cheap and compact and, through thermal stabilization, have time lags of less than 100 milliseconds per year and short-term stabilities of less than 1 picosecond per second. Cheap quartz references, as are used in commercial navigation systems, have accuracies in the range of $10^{-6}$, while military systems with precise temperature compensation have accuracies in the range of $10^{-8}$ to $10^{-10}$. This accuracy allows a more precise determination of location, since the position relative to the positioning satellites is expressed in units of time by means of the velocity of light. Atomic references are clearly more expensive, but they offer considerably higher accuracy. Cesium clocks are the international standard by which the second is defined, and thus are absolutely accurate by definition. However, they nevertheless have short-term variations, for example due to the eventual interaction time of the atoms with the oscillating field. Strontium clocks and aluminum ion clocks are the most accurate known references, but they require highly complicated laser systems and wells in order to cool the atoms and maintain them and to measure their reference frequency. Moreover, the reference frequencies provided thereby cannot be selected or varied, or can be selected or varied only to an insufficient extent. Further information on quartz references and atom-based frequency references are given in Reference 1 ["Quartz Crystal Resonators and Oscillators for Frequency Control and Timing Applications—A Tutorial"; J. R. Vig; Rev. 8.5.6.2; available at http.//www.ieee-uffc.org/frequency-control].

For some time now, optical resonators have also been used as frequency references, mainly to stabilize the optical frequency of a laser, as described in Reference 2 ["Laser-Based Measurements for Time and Frequency Domain Applications: A Handbook"; P. Maddaloni, M. Bellini, P. De Natale; Taylor & Francis (2013)]. One advantage of such references is the uninterrupted interaction of the light with the resonator. Disadvantages include susceptibility to vibration, frequency shifts due to changes of length, and frequency shift due to deposits on or alterations in the material of the mirror surface. In contrast to quartz-based references, optical references do not need moving parts. Unlike atom-based references, optical references also do not have intrinsic magnetic field dependency. Optical references are clearly cheaper than atomic references, but do not achieve their accuracy.

On the other hand, in view of the increasing transition from electronic methods to optical methods in telecommunications and data processing, it would be desirable to have highly accurate optical references that could be seamlessly integrated into modern data transmission and data processing structures.

Finally, in addition to said application problems, there is the fundamental theoretical problem that the current atomic time standards are dependent on physical parameters such as the fine structure constants. In this respect, a long-term stable, purely optical reference, which is determined only by geometry and the speed of light, would have a fundamental appeal, but currently, the necessary accuracy to be able to compete with atomic references cannot be achieved by optical references.

SUMMARY OF THE INVENTION

Therefore, it is the task of this invention to make available a method and a device for producing a reference frequency that avoids the disadvantages mentioned above. In particular, the reference frequency should be both highly stable and comparably cheap. Preferably, the reference frequency should lie in a frequency range between about 100 MHz and several terahertz and, as far as possible, be freely selectable. Especially preferably, the method according to the invention or the device according to the invention should allow the integration of the production of the reference frequency into photon structures, as are increasingly used in communications and data processing technology.

The heart of the invention is the understanding that optical resonators can be designed so that in the region of the desired operating parameters (for example, a pressure or a temperature; basically speaking, however, magnetic or electrical field strengths, for example, would also be conceivable), two different optical modes each exhibit a dependence of its frequency on changes of the operating parameters, in particular the length or the temperature of the relevant resonator, said dependence, however, having nearly the same sensitivity for both modes. Consequently, the difference $\Delta f$ between the frequency f1 of the first mode and the frequency f2 of the second mode, i.e., $\Delta f=|f1-f2|$, is stable with respect to changes of the parameters, so that $\Delta f$ can serve as a stable reference frequency. Calculations showed that for a nearly identical behavior of the modes in dependence on an operating parameter, in particular the resonator length or the temperature, a negligible deviation of the sensitivities of f1 and f2, which can typically be up to ±0.1%, is tolerable. It should be noted here that the term optical modes in general is not necessarily intended to mean visible light, rather it can also mean longer-wave or shorter-wave modes.

Correspondingly, according to the invention, a method for producing a reference frequency $\Delta f$ using a first optical resonator and a second optical resonator is specified, wherein the first resonator has a first resonator mode with a first frequency f1 and the second resonator has a second resonator mode with a second frequency f2, wherein the frequencies of the two resonator modes are functions of an operating parameter BP, in particular a temperature, and take on the values f1 and f2 at a set value of $BP_0$ of the operating parameter, so that $f1(BP_0)=f1$ and $f2(BP_0)=f2$, wherein the resonators are designed so that the first derivative of the frequencies f1(BP), f2(BP) with respect to BP, or at least a difference ratio around $BP_0$, corresponds up to a deviation of a maximum of ±0.1%, wherein light of the first frequency f1 is stabilized at the first frequency f1 by means of the first resonator and light of the second frequency f2 is stabilized at the second frequency f2 by means of the second resonator, and wherein the difference between the stabilized frequencies f1 and f2, $\Delta f=|f1-f2|$, is determined in order to obtain the stabilized reference frequency $\Delta f$.

The percent deviation in this case can be given with respect to f1 or f2.

For clarification, it should be noted that said deviation is basically dependent on the range of variation of the operating parameter BP. For example, if a stabilization to ±1 mK can be achieved for the temperature as the operating parameter, then a difference between the thermal coefficients of 0.1% will lead to a stability of $10^{-6}$, which corresponds to an inexpensive quartz oscillator.

Lasers are usually used to produce the light of the resonator modes, but other light sources can also be used. The latter applies in particular because the principle of the invention is basically not limited to the optical wavelength range, i.e., in principle, this approach can be similarly employed even with shorter or longer wavelengths, for example with radio, microwave, or terahertz systems.

It is also possible to use a single laser, which basically generates light of frequency f1 and which at the same time can be used in a substantially known way, for example by means of an acousto-optical frequency shifter, to produce light of frequency f2 as well. Analogously, therefore, according to the invention, a device for producing a reference frequency $\Delta f$ is provided, wherein a first optical resonator, which has a first resonator mode with a first frequency f1, and a second optical resonator, which has a second resonator mode with a second frequency f2, are provided, wherein the frequencies of the two resonators are functions of an operating parameter BP, in particular a temperature, and the values f1 and f2 take on a set value $BP_0$ of the operating parameter, so that $f1(BP_0)=f1$ and $f2(BP_0)=f2$, wherein the resonators are designed such that the first derivative of the frequencies f1(BP), f2(BP) with respect to BP, or at least a difference ratio around $BP_0$, corresponds up to a deviation of a maximum of ±0.1%, the device further comprising first light producing means to produce light of the first frequency f1 and second light producing means to produce light of the second frequency f2, wherein the first light producing means and the second light producing means preferably together comprise at least one laser, the device further comprising first stabilization means in order to stabilize the first frequency f1 and second stabilizing means in order to stabilize the second frequency f2, and wherein determining means are provided in order to determine the difference between the stabilized frequencies f1 and f2, $\Delta f=|f1-f2|$, and to maintain the stabilized reference frequency $\Delta f$.

In practice, the important influencing factor, or the important operating parameter, is the temperature, since it causes a change of the dimensions, in particular the resonator length of the relevant resonator. The frequency f1 of the first mode of a first resonator of a resonator length $L_1$ is given in the case of a Fabry-Pérot resonator by the condition $f1=c*m_1/(2*n_1*L_1)$, wherein c is the velocity of light, $n_1$ is the refractive index for the first resonator mode in the first resonator and $m_1$ is an whole number. This is valid for a certain temperature, an operating point temperature, at which the resonator length is $L_1$. If one takes into consideration the temperature dependence of the resonator length $L_1$ by means of a linear temperature coefficient $\beta_1$ of the first resonator, the temperature-dependent frequency f1 is $f1(T)=c*m_1/(2*L_1*(1+\beta_1*T))$, wherein T is the temperature difference from the operating point temperature. Thus, approximately speaking, $f1(T)=c*m_1*(1-\beta_1*T)/(2*L_1)$.

Analogously, for the temperature-dependent frequency f2 of a second resonator of resonator length $L_2$, one approximately obtains $f2(T)=c*m_2*(1-\beta_2*T)/(2*L_2)$, wherein $m_2$ is an whole number, $n_2$ is the refractive index of the second resonator mode in the second resonator, and $\beta_2$ is the linear temperature coefficient of the second resonator. If one now writes the difference $f1(T)-f2(T)$ and sets its derivative with respect to T to zero, one obtains the following condition that must be satisfied in order to achieve an exactly identical temperature behavior of the two modes:

$$m_1*\beta_1*L_2*n_2=m_2*\beta_2*L_1*n_1$$

Exactly this same condition also results even if one starts with ring resonators, which are also called whispering gallery mode resonators, wherein in this case the resonator lengths $L_1$, $L_2$ are given by the circumferences of the resonators and $$f1,2(T)=c*m_{1,2}*(1-\beta_{1,2}*T)/(2*L_{1,2})$$

is approximately valid. The whole numbers $m_1$, $m_2$ can therefore be understood as the number of wavelengths of the first or second resonator mode in the first or second resonator.

Employing the above condition, the resonators can thus be designed by one skilled in the art so that known geometries and the linear temperature coefficients can be appropriately matched—in particular through a suitable choice of materials. Especially in the case of a known material, an appropriate dimensioning can be carried out, or in the case of a given dimensioning, a corresponding choice of material can be made.

Typically, a numerical treatment is first carried out and then the resonator is manufactured on the basis of this. Due to manufacturing tolerances, there may turn out to be a slight deviation from the above equation at a certain operating point temperature $T_1$. In other words, the equation would in this case only be satisfied if $m_{1,2}$ are not whole numbers. However, in practice, it turns out that, on the one hand, the properties of the optical resonators can be modified through a tailored change of temperature or adjustment of the temperature so that the equation is in the end satisfied at another working point temperature $T_2 \neq T_1$.

On the other hand, detailed calculations and experiments showed that for a nearly identical behavior of the modes in dependence on a parameter, in particular the resonator length or the temperature, the above equation need not be identically satisfied, but rather a slight deviation, which typically can be up to 0.1%, is tolerable. Only at greater deviations does the achievable stability of the reference frequency become so low that other methods such as generation of a reference frequency by means of quartz oscillators are of more interest in practice, in particular due to cost. In other words, the design condition to be met for the design of the resonators runs as follows:

$$m_1*\beta_1*L_2*n_2=m_2*\beta_2*L_1*n_1 \pm 0.1\%$$

or in other words:

$m_1 * \beta_1 * L_2 * n_2 = m_2 * \beta_2 L_1 * n_1$ up to a deviation of a maximum of ±0.1%.

The percent deviation can in this case be given with respect to the left side ($m_1 * \beta_1 * L_2 * n_2$) or to the right side ($m_2 \beta_2 * L_1 * n_1$) of the equation.

Alternatively, a stable mode pair, thus a first resonator mode and a second resonator mode, whose frequencies exhibit nearly the same temperature behavior, can be produced by coupling two modes. The coupling, which can take place in a substantially known way by the appropriate design of the resonators, produces a split mode spectrum, wherein the coupling strength, 2*g, represents the reference frequency $\Delta f$. Correspondingly, two successive modes, which form the first resonator mode with frequency f1 and the second resonator mode [with frequency] f2, can be found in the split mode spectrum, wherein $\Delta f = |f1 - f2|$. The two coupled resonator modes are also called a coupled mode pair below.

This is why it is provided in a preferred embodiment of the method according to the invention that the first optical resonator have a resonator length $L_1$ and a linear temperature coefficient $\beta_1$ and the second optical resonator have a resonator length $L_2$ and a linear temperature coefficient $\beta_2$, wherein the resonators are designed so that $m_1 * \beta_1 * L_2 * n_2 = m_2 * \beta_2 * L_1 * n_1$ up to a deviation of a maximum of ±0.1%, with $m_1$, $m_2$ being whole numbers, which correspond to the number of wavelengths of the first or second resonator modes in the first or second resonators, and $n_1$, $n_2$ are the refractive indices for the first resonator mode in the first resonator and the second resonator mode in the second resonator, or that coupled modes are present in the first and second resonator and a mode spectrum split due to the coupling contains the first resonator mode and the second resonator mode.

Analogous to the above, it is provided in a preferred embodiment of the invention that the first optical resonator have a resonator length $L_1$ and a linear temperature coefficient $\beta_1$, and the second optical resonator have a resonator length $L_2$ and a linear temperature coefficient $\beta_2$, wherein the resonators are designed so that $m_1 * \beta_1 * L_2 * n_2 = m_2 * \beta_2 * L_1 * n_1$ up to a deviation of a maximum of ±0.1%, with $m_1$, $m_2$ being whole numbers, which correspond to the number of wavelengths of the first or second resonator mode in the first or second resonator, and $n_1$, $n_2$ are the refractive indices for the first resonator mode in the first resonator and the second resonator mode in the second resonator or that coupled modes are present in the first and second resonator and a mode spectrum split due to the coupling contains the first resonator mode and the second resonator mode.

Basically speaking, various means and methods known from the prior art can be used to stabilize the frequencies f1, f2. A well-established method is the Pound-Drever-Hall technique. Correspondingly, in a preferred embodiment of the device according to the invention, it is provided that the first stabilization means comprise the first modulation means to modulate sidebands on the light of the first frequency f1, and first demodulation means with a first detector to generate a first error signal via the modulated light of the first frequency f1 that is transmitted or reflected back to the first detector, and first regulating means to regulate the first light producing means via the first error signal so that the first frequency f1 becomes stabilized, and that the second stabilizing means comprise second modulation means to modulate sidebands on the light of the second frequency f2, and second demodulation means with a second detector produce a second error signal via the modulated light of the second frequency f2 that is transmitted or reflected back to the second detector, and second regulating means to regulate the second light producing means via the second error signal so that the second frequency f2 becomes stabilized. In other words, symmetry of the intensity of the side bands around the central frequency is determined with the demodulation means and the light is fine-tuned until there is a distribution that is symmetric as possible.

To produce the stable mode pair, the first and second optical resonators do not necessarily have to be separate resonators for the above condition to be satisfied. Rather, the first and second optical resonators can be formed simultaneously by a single resonator in which both modes are present. This, too, is not limited to a special type of resonator; in particular, a Fabry-Pérot interferometer or resonator or a ring resonator can also be used as resonator in this case.

Thus, it is provided in a preferred embodiment of the method according to the invention that the first resonator also forms the second resonator at the same time and is identical to it. Analogously, it is provided in a preferred embodiment of the device according to the invention that the first resonator simultaneously also forms the second resonator and is identical to it.

Of course, such a first resonator, which also forms the second resonator at the same time and is identical to it, is also suitable for the production of coupled modes. For example, a mode coupling can take place in a simple way by placing a partially reflecting element in the beam path, so that oppositely coupled modes are produced. In other words, the reflecting element preferably reflects only a part of the light and is permeable to a part of the light. A stable mode pair in which the direction of propagation of the one resonator mode runs clockwise and the direction of propagation of the other resonator mode runs counterclockwise can be produced in this way in particular with ring resonators. Thus, it is provided in a preferred embodiment of the method according to the invention that the mode coupling be produced by means of an at least partly reflecting element. Analogously, it is provided in a preferred embodiment of the device according to the invention that an at least partly reflecting element is provided to produce the mode coupling.

If the first and second resonators are separate resonators, there is a possibility of producing coupled modes by coupling the resonators, wherein the coupling can take place, for example, evanescently. Ring resonators in particular provide for such evanescence, since the coupling of the light into such resonators also usually takes place evanescently. Thus, it is provided in a preferred embodiment of the method according to the invention that the mode coupling is produced by evanescent coupling of the first resonator with the second resonator. Analogously, it is provided in a preferred embodiment of the device according to the invention that the first resonator is evanescently coupled with the second resonator to produce the mode coupling.

Detailed analyses of optical resonators of the Fabry-Pérot type showed that, with skilled design of the resonator, various spatial modes can be used to produce a stable mode pair. For modes with the same longitudinal index but different transversal indices, the frequency difference of the modes, $\Delta f = |f1 - f2|$, can be made extremely stable. The choice of the basis for describing modes with longitudinal and transversal indices is not important. For example, the Hermite-Gauss basis can be used. Thus, it is provided in a preferred embodiment of the method according to the invention that the two resonator modes can be described each by one longitudinal index and two transversal indices, wherein the first resonator mode and the second resonator mode have the same longitudinal index and at least one different transversal index. Analogously, it is provided in a preferred embodiment of the device according to the invention that the two resonator modes can each be described by one longitudinal index and two transversal indices, wherein the first resonator mode and the second resonator mode have the same longitudinal index and at least one different transversal index. It should be noted that in the optical resonators of the Fabry-Pérot type it is possible to vary the radius of the mirrors in addition to varying the resonator length, and with skilled design of said radii of curvature, the stability of the reference frequency can be further improved.

Basically speaking, by regulating the relevant operating parameter, in particular through temperature regulation, the relevant resonator length of the optical resonators can be controlled and thus the stability of the reference frequency $\Delta f$ can be improved. However, it turns out that the long-term stability can be dramatically improved by producing light of a third frequency f3 that has a greater dependence on the operating parameter than $\Delta f$, in particular a higher temperature dependence, and using the difference of said third frequency f3 with one of the two other frequencies f1 or f2 as a comparison frequency f4. The greater dependence can be mathematically given in general as an absolutely larger first derivative (with respect to the relevant operating parameter, in particular the temperature) or at least as an absolutely larger difference ratio around $BP_0$.

By determining the ratio or the difference between f4 and $\Delta f$ once at the operating point (thus at $BP_0$), an error signal can be produced by the subsequent, continuous comparison of f4 and $\Delta f$, and said error signal can be used to regulate the operating parameter, in particular the temperature, for example by means of a heating current source and/or a Peltier element. Because of the higher sensitivity of f3, $\Delta f$ can thus be regulated considerably more sensitively than would be possible by means of $\Delta f$ or f1 and f2 alone. Thus, it is provided in a preferred embodiment of the method according to the invention that light of a third frequency f3 is produced and stabilized by means of a resonator, wherein f3 has a greater dependence on the operating parameter than $\Delta f$, in particular on the temperature, that a comparison frequency f4 is given by f4=|f3−f1| or f4=|f3−f2|, and that the ratio f4/$\Delta f$ or the difference f4−$\Delta f$ is determined and used to control operating parameter regulating means, in particular temperature regulating means, which are provided to regulate the operating parameter, in particular the temperature, of the first resonator and/or the second resonator. Analogously, it is provided in a first embodiment of the device according to the invention that a third light producing means is provided to produce light of a third frequency f3 along with a resonator for stabilization, wherein f3 has a greater dependence on the operating parameter than $\Delta f$, in particular on the temperature, that a comparison frequency f4 is given by f4=|f3−f1| or f4=|f3−f2|, wherein additional determining means are provided to determine the ratio f4/$\Delta f$ or the difference f4−$\Delta f$, and that operating parameter regulating means, in particular temperature regulating means, are provided to control the operating parameter, in particular the temperature, of the first resonator and/or the second resonator in dependence on the ratio f4/$\Delta f$ or the difference f4−$\Delta f$.

It should be noted that the light of frequency f3 does not necessarily have to be visible light, but rather can also be longer-wave or shorter-wave light. All in all, the reference frequency can be stabilized over the long term in this way without needing an external reference produced atomically or otherwise.

The resonator or resonators that is/are present or an additional resonator can be used to stabilize the light of frequency f3, so that all conceivable design or manufacturing cost-related requirements can be met. Thus, it is provided in a preferred embodiment of the method according to the invention that the first resonator and/or the second resonator or a third resonator are used to stabilize the light of the third frequency f3. Analogously, it is provided in a preferred embodiment of the device according to the invention that the resonator for stabilization of the light of the third frequency f3 is the first resonator and/or the second resonator or a third resonator.

It is provided in an especially preferred embodiment of the method according to the invention that the light of the third frequency f3 is formed via a comb mode of a frequency comb. Analogously, it is provided in an especially preferred embodiment of the device according to the invention that the third light producing means comprise a frequency comb to produce the light of the third frequency f3 as comb mode of the frequency comb or by means of a tooth spacing of the comb mode of the frequency comb. The stabilization of f3 in this case can take place via the first and/or second resonator by setting a tooth spacing of the frequency comb by the resulting $\Delta f$, possibly multiplied by a factor. Said stabilization thus takes place before the feedback loop is carried out by the comparison of f4 to $\Delta f$. The use of a frequency comb has the advantage that f3 can easily be selected to be so large that in any case a clearly greater temperature dependence is given for f3 or f4 than for $\Delta f$, which can be used for a correspondingly precise long-term stabilization of $\Delta f$ by means of the temperature regulation described above. Typically, in practical applications, f3 is selected to be in the range of 100 to 1000 THz.

As already stated, different types of resonators can be used, in particular Fabry-Pérot resonators or interferometers, or ring resonators (also called whispering gallery mode resonators). Correspondingly, it is provided in a preferred embodiment of the method according to the invention that a Fabry-Pérot resonator is used as the first resonator and/or the second resonator. Analogously, it is provided in an especially preferred embodiment of the device according to the invention that the first resonator and/or the second resonator is a Fabry-Pérot resonator. It is further provided in a preferred embodiment of the method according to the invention that an optical ring resonator is used as the first resonator and/or as the second resonator. Analogously, it is provided in an especially preferred embodiment of the device according to the invention that the first resonator and/or the second resonator is an optical ring resonator.

Said optical resonators in particular have the advantage of miniaturizability, so that they are easily integrated into photonic structures on optical chips or in microsystems that are suitable for mass production. Fabry-Pérot resonators can be implemented, for example, as waveguides with integrated Bragg mirrors. In order to form ring resonators, closed waveguides may be used, which can, for example, be circular, elliptical, or stadium-shaped, but in principle can take any closed form. Correspondingly, it is provided in a preferred embodiment of the method according to the invention that an optical resonator made as a waveguide on an optical chip is used as the first resonator and/or as the second resonator. Analogously, it is provided in an especially preferred embodiment of the device according to the invention that the first resonator and/or the second resonator is made as a waveguide on an optical chip.

BRIEF DESCRIPTION OF THE FIGURES

The invention will now be explained in more detail by means of embodiment examples. The drawings are exemplary and are intended to represent the ideas of the invention, but not to limit it in any way or even to reproduce it conclusively.

Here:

FIG. 2b shows an enlarged detail view of a portion of FIG. 2a;

"WAYS OF IMPLEMENTING THE INVENTION" to the following:

DETAILED DESCRIPTION OF

Exemplary Embodiments of the Invention

Figure 1:
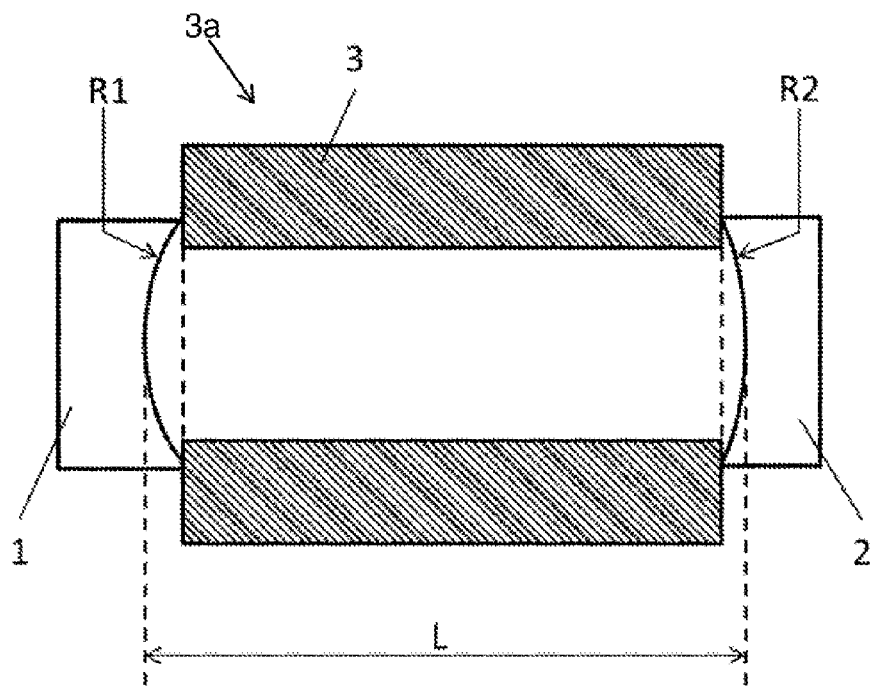
FIG. 1 shows a schematic representation of an optical resonator of the Fabry-Pérot type (also called "cavity")

FIG. 1 shows a schematic representation of a Fabry-Pérot resonator 3a, which can be used according to the invention to produce a stable reference frequency. In such an optical resonator 3a, the frequency of an optical mode is determined by radii of curvature R1, R2 of a first mirror 1 and a second mirror 2 and by a length L of the resonator 3a. The frequency f of a mode of the resonator 3a in vacuum is $$f = \frac{c}{2L}\left[l + \frac{1+m+n}{\pi}\cos^{-1}\left(\sqrt{1-\frac{L}{R_1}}\sqrt{1-\frac{L}{R_2}}\right)\right]$$

The length L of the resonator is determined by the dimension of a mount 3 of the mirrors 1, 2. The velocity of light c determines the round trip time of a light particle or photon in resonator 3a. Said round trip time is further determined by the transversal mode indices m and n, which are part of the whole, positive numbers, including 0. The Hermite-Gauss basis for the resonator modes was chosen for the above formula. The principle represented herein is, however, basis-independent and can likewise be described in any other complete basis.

The longitudinal mode index is given by l, also part of the whole positive numbers. The frequency difference between two modes with longitudinal indices l1 and l2 and transversal indices m1=m2=n1=n2=0 is given by $$\Delta f(0, 0) = \frac{c}{2L}(l_2 - l_1)$$

and thus is always dependent of the length L of the resonator 3a. According to the invention, the frequency difference $\Delta f$ between two modes with the same longitudinal index l, but different transversal indices, for example m1=0, n1=0 and m2=1, n2=0, can be used as reference frequency, since it proves to be extremely stable, as further explained below. The resulting frequency difference $\Delta f$ is $$\Delta f = \frac{c}{2L}\frac{m+n}{\pi}\cos^{-1}\left(\sqrt{1-\frac{L}{R_1}}\sqrt{1-\frac{L}{R_2}}\right)$$

Through the non-monotonic behavior of the arccos function it is possible to find combinations of L, R4 and R2 for which the dependence of the frequency on length has reversal points and even deviates from the reference value only in the third order.

Figure 2A:
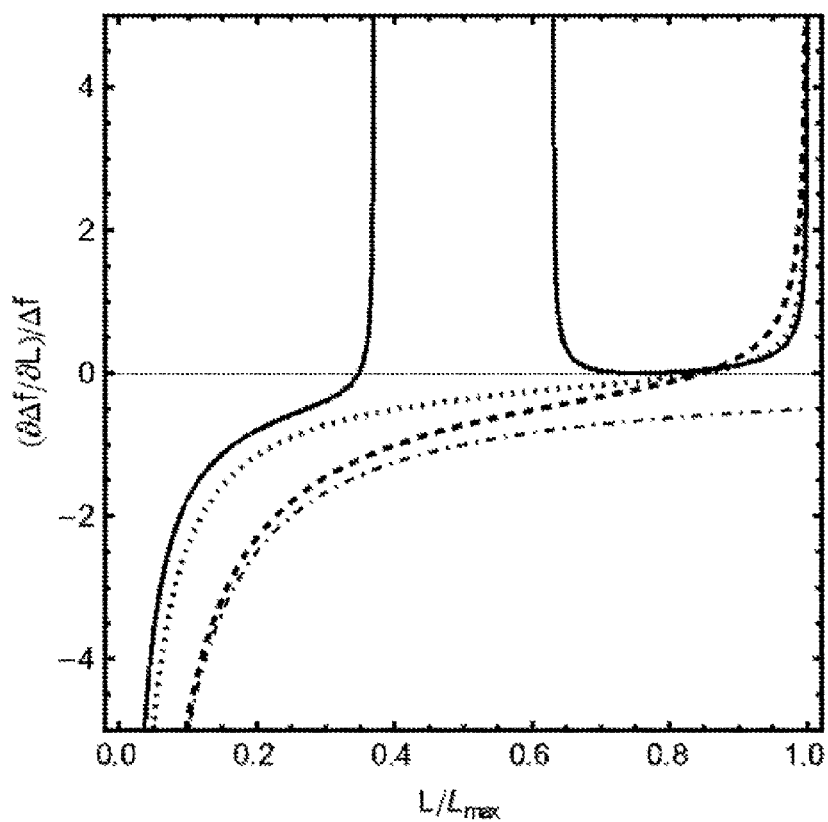
FIG. 2a shows the change of the frequency dependences with length L of the resonator in FIG. 1.

This can be seen in FIG. 2a. Here the first derivative of the frequency difference or the reference frequency $\Delta f$ with respect to the resonator length L is shown for different combinations of R1 and R2. In FIG. 2a, the resonator length L is normalized to the maximum length $L_{max}$=R1+R2 for all functions. The derivative is in turn normalized to the local frequency difference or the local reference frequency $\Delta f$ at the length $L/L_{max}$. The functions shown in FIG. 2a correspond to the following configurations of resonator 3a mirror 1 flat, mirror 2 curved ("planoconcave," dashed line); mirror 1 and mirror 2 having the same radius of curvature ("symmetric," dotted line); mirror 1 with radius R1, mirror 2 with radius R2=$\Phi$*R1 ("optimum," solid line). The factor $\Phi$ is further explained below.

For comparison, FIG. 2a also shows the behavior of the normalized derivative for the frequency of a single optical mode with m=n=0 (dot-dash line).

Figure 2B:
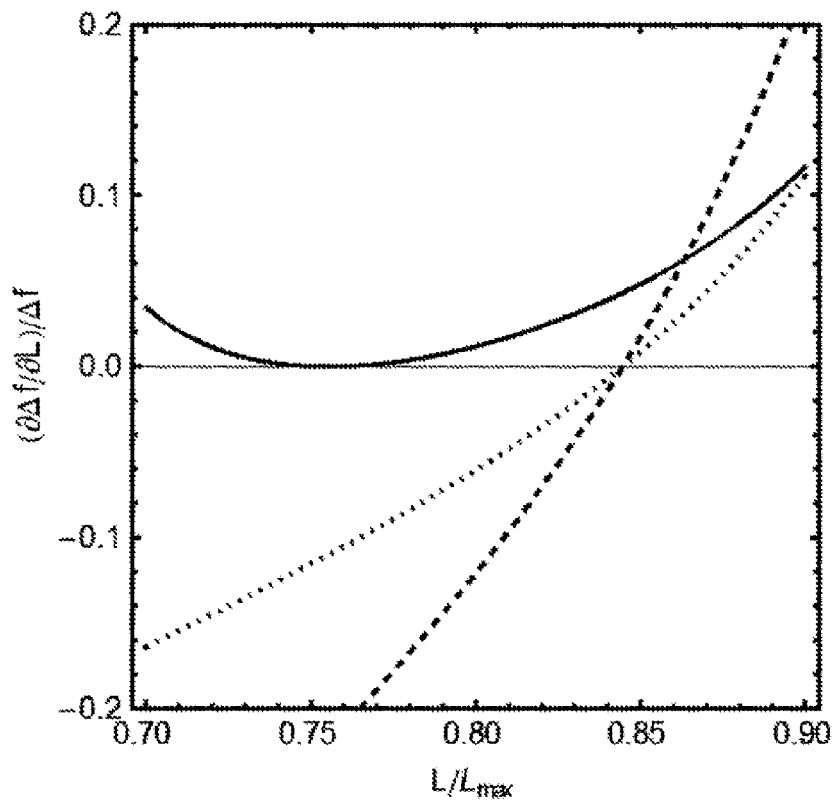

The region around $L/L_{max}$~0.8 is shown in detail in FIG. 2b. Here one can clearly see that the derivatives for both the symmetric and the planoconcave geometry cross through zero, while the derivative for the optimum case even has quadratic behavior.

The optimum case can be achieved by setting the ratio of the radii of curvature $\Phi$ to be ~1.7048. The most stable point then lies at an optimum resonator length of $L_{opt}$~2.0428*R1. The quantity $L_{opt}$ can be found by solving the transcendental equation $$L_{opt} = \frac{\tan L_{opt}}{1 + \tan L_{opt}}.$$

The optimum ratio $\Phi$ of the radii of curvature R1, R2 can then be expressed as $$\Phi = \frac{L_{opt}(1 - L_{opt})}{1 - L_{opt} - \cos^2 L_{opt}}.$$

The zero-crossing length for symmetric and planoconcave resonators 3a can thus be found by solving the equation $$\frac{1}{2}\sqrt{\frac{L_x}{1 - L_x}} = \cos^{-1}(1 - L_x)$$

with $L_x = L/L_{max}$, and is ~0.8446*$L_{max}$.

Here it should be noted that all resonators 3a with R2/R1<$\Phi$ have at least one zero crossing in the first derivative. With favorable combinations of radii R1, R2 and length L, a stable frequency difference $\Delta f$ between the selected modes can thus be determined. Such a resonator 3a can thus serve as frequency reference that is insensitive, for example, to changes of length caused by vibrations.

Factors that affect both the length L and the radii of curvature R1, R2 of the mirrors 1, 2 have a more noticeable effect on the reference frequency $\Delta f$. The most important factor is the temperature, especially in a vacuum. It can be established by expansion of the expression for the frequency difference $$\Delta f(T) = \frac{c}{2L(T)} \frac{m+n}{\pi} \cos^{-1}\left(\sqrt{1 - \frac{L(T)}{R_1(T)}} \sqrt{1 - \frac{L(T)}{R_2(T)}}\right) \text{ with}$$

$$L(T) = L\left(1 + \alpha_{S,1}T + \frac{1}{2}\alpha_{S,2}^2 T^2\right) \text{ and}$$

$$R_q(T) = R_q\left(1 + \alpha_{R_q,1}T + \frac{1}{2}\alpha_{R_q,2}^2 T^2\right)$$

(with q=1 or q=2). Only linear and quadratic terms of the temperature dependence, which in practically all cases are dominant, were given here. Here $\alpha_{S,1}$ and $\alpha_{S,2}$ are the linear and quadratic coefficients of expansion of the mount, while $\alpha_{R_q,1}$ and $\alpha_{R_q,2}$ are the coefficients of expansion of the mirrors. T is the temperature difference at an operating point temperature at which the length is L.

For the sake of simplicity, it is assumed below that the two mirrors 1, 2 consist of the same material, so that $\alpha_{R_1,1} = \alpha_{R_2,1} = \alpha_{R,1}$ and $\Delta_{R_1,2} = \alpha_{R_2,2} = \alpha_{R,2}$. At this point it should be noted that the temperature dependence can be reduced still further by an appropriate choice of different coefficients—for example by the selection of different materials—for the two mirrors 1, 2.

Since, as explained above, small changes of length are negligible, the reference frequency $\Delta f(T)$ mainly changes because of the thermal expansion of the mirrors 1, 2. The mirrors 1, 2 can be made of a material that, at a certain temperature, preferably the operating point temperature, has a zero crossing of the linear temperature coefficient, in other words, $\alpha_{R,1}=0$, so that only a quadratic temperature dependence exists. Said materials are routinely used in optics, for example ULE® glass at room temperature or silicon at 124 K.

However, if the mount 3 consists of a material with a nonvanishing linear thermal coefficient, the frequency difference between transversal ground modes $\Delta f(T, 0, 0)$ and their optical frequencies will have a corresponding thermal dependence.

Figure 4:
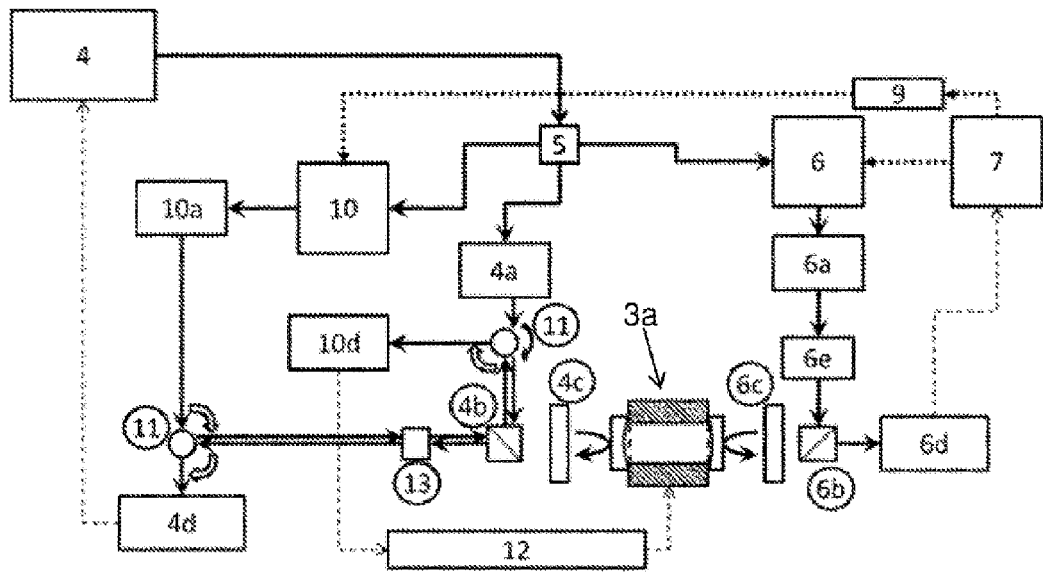
FIG. 4 shows a schematic representation of another embodiment of the device according to the invention, wherein the length of the resonator is stabilized by means of the temperature at the ratio of two frequency differences between three optical modes.

Said sensitivity is utilized for self-stabilization of the resonator in the embodiment examples in FIGS. 4 and 5 that are described below.

In the above description it was always assumed that the optical resonator 3a is situated in an evacuated container. The invention can, however, be made functional even in a light-permeable medium like air. For this, the dependence of the velocity of light on refractive index and its dependence on pressure P, temperature T, and other ambient factors X must be introduced into all of the formulas by means of the substitution c→c/n(T,P,X). In this expansion, ambient effects that are dependent on the temperature, for example pressure P in an airtight resonator 3a, can be compensated by slight modification of the parameters. Temperature-independent parameters, for example a contamination of the medium, cannot be compensated and lead to a frequency shift.

Figure 3:
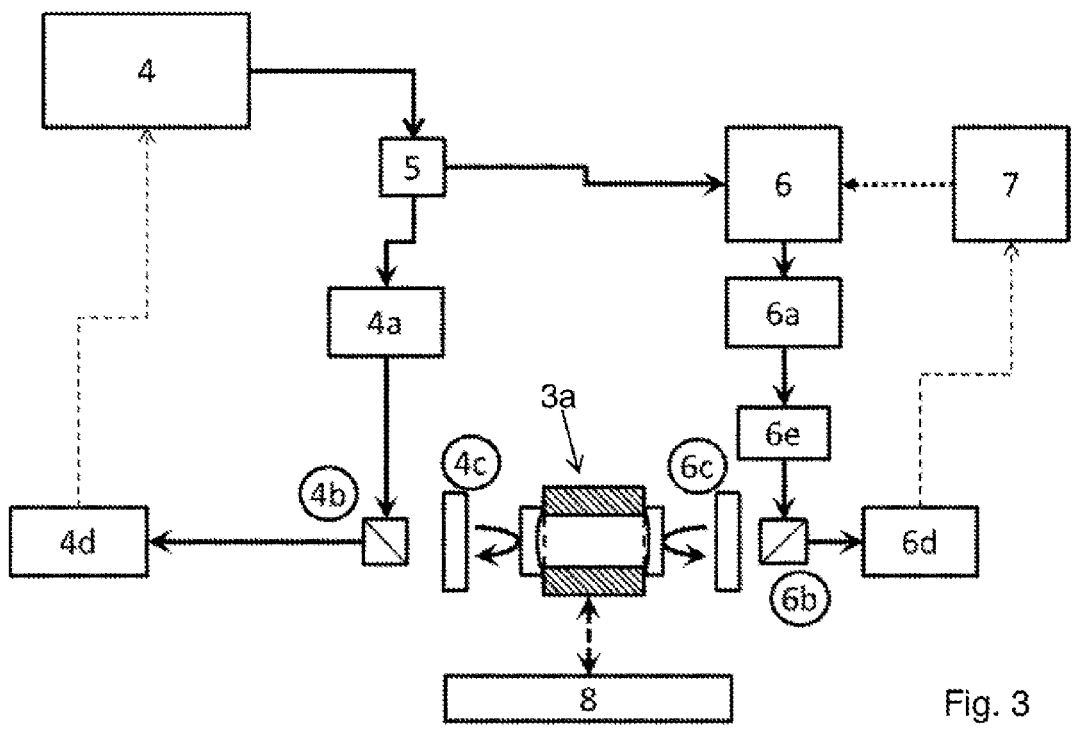
FIG. 3 shows a schematic representation of an embodiment of a device according to the invention for producing a reference frequency, wherein the frequency of an oscillator is stabilized at the reference frequency.

FIG. 3 schematically shows an embodiment example of a device according to the invention for producing the reference frequency $\Delta f$, wherein the frequency of a regulatable oscillator 7 is stabilized at the reference frequency $\Delta f$. A laser 4 produces a linearly polarized optical wave with low bandwidth. It is directed to an electro-optical modulator 4a, which produces sidebands on the optical wave. The modulated optical wave is directed through a polarized beam splitter 4b and a quarter-wave optical retarder 4c to the optical resonator. The latter is again shown as a Fabry-Pérot resonator 3a in FIG. 3, and also in FIGS. 4 and 5, but basically any other type of resonator, in particular a ring resonator, could also be used.

The polarization optics 4b and 4c ensure that the light reflected by resonator 3a exits the beam splitter 4b in the direction of a demodulator 4d. The sidebands enable, by means of the demodulator 4d, an error signal to be produced, by means of which the laser frequency can be stabilized at the frequency f1 of a first resonator mode, which is a transversal ground mode M1 (with mode indices l1, m1=0, n1=0) of the optical resonator 3a, which is indicated in FIG. 3 by the dashed arrow pointing to laser 4. Said stabilization behavior is known as Pound-Drever-Hall behavior, see Reference 6 [Dreyer, R. W. P., Hall, J. L., Kowalski, F. V., Hough, J., Ford, G. M., Munley, A. J., & Ward, H; "Laser phase and frequency stabilization using an optical resonator"; Applied Physics B, 31(2), 97-105 (1983)].

A part of the laser beam of the laser 4 is now directed to an acousto-optical frequency shifter 6 by means of a beam splitter 5. Said beam is directed through a second electro-optical modulator 6a and guided through a second polarizing beam splitter 6b and a second quarter-wave optical retarder 6c to the optical resonator 3a. The purpose of this second beam is to stimulate a second resonator mode in the form of a higher transversal mode M2 with the same longitudinal index l2=l1 (for example with indices m2=1, n2=0) and the frequency f2. For this, the beam profile must be matched to that of the desired second resonator mode. This can be achieved, for example, via a structured phase plate 6e, as often takes place in optics and quantum optics.

Said beam, after its re-exit or reflection by the resonator 3a, is directed through the polarization optics 6b, 6c to a second demodulator 6d. The second electro-optical modulator 6a can be driven at a different frequency from the electro-optical modulator 4a in order to enable clean demodulation at the second modulator 6d. The error signal here is ascertained directly by the Pound-Drever-Hall technique: The frequency f2 is given by f1+Δf. However, the laser beam has the frequency f1+f(7), wherein f(7) is the frequency of oscillator 7. If f(7)≠Δf, then the Pound-Drever-Hall measurement outputs an error signal. The error signal thus arises through the difference between f1+f(7) and f2. Therefore, one can say in simpler terms that the resulting error signal corresponds to the difference between the oscillator frequency f(7) and Δf, and the frequency f(7) of the oscillator 7 is stabilized to the frequency differences between the two stimulated modes of the resonator 3a, thus to the reference frequency Δf.

A temperature regulator 8 can minimize the already quite low sensitivity of the structure even further. Such regulators are commercially available for stabilization up to variations around $10^{-3}$ K.

The resonator 3a itself can be used to achieve a still higher frequency accuracy or stability of the reference frequency Δf. An example of such a system is shown in the embodiment example in FIG. 4. Here an additional partial beam is guided from beam splitter 5 to an additional acousto-optical modulator 10. Said modulator is driven at a frequency that is produced directly by oscillator 7 by means of a suitable fixed frequency multiplier 9, which multiplies the incoming frequency by a factor $a_f$. The acousto-optical modulator 10 thus produces a beam that, at the desired operating point, is exactly resonant with an additional longitudinal third resonator mode M3 (with indices l3≠l1, n=0, m=0) having a frequency f3. By means of an additional electro-optical modulator 10a, which is connected after the acousto-optical modulator 10, sidebands are produced on the optical wave—similar to the function of the electro-optical modulator 4a described above.

Since the frequency spacing f4 between the frequency f3 of said third resonator mode and the laser frequency or the frequency f1 of the first resonator mode has a far greater dependence on temperature than the frequency spacing Δf of the second frequency f2 of the higher transversal mode M2 of the laser frequency f1, a temperature deviation will lead to the resonance condition for f3 no longer being satisfied. This deviation is registered by a third demodulator 10d. Similar to what was described above, the error signal can be ascertained as the difference between f1+Δf*$a_f$ and f3. Here, f3 is the frequency of the resonator mode M3 at the set value of the temperature. More simply expressed, the error signal thus corresponds to the difference between f4 and Δf*$a_f$. The error signal can now be sent to a heating current source 12 in order to control it.

In the example shown, optical circulators 11 and additional polarization optics 13 are used to direct the different beams to the desired demodulators 4d, 10d. The absolute frequency deviation f4 is proportional to the difference of the longitudinal indices l3-l1. Said difference is limited to about 1 GHz in this example by the modulation frequency of the acousto-optical modulator 10, but it can be higher by orders of magnitude in other embodiments. The latter can be achieved, for example, by the different light frequencies f1, f3 and possibly f2 being produced by different laser sources.

In practice, the mode index l1 can be a number in the range from about $10^1$ to $10^5$, since the optical wavelength is ~1 μm in order of magnitude. The frequency f1 is thus a few hundred THz. Said frequency f1 is clearly greater than Δf and f4. In order to be able to choose f4 to be correspondingly great as well and thus to enable a considerably more accurate self-stabilization of resonator 3a, an optical frequency comb 15 can be used; see FIG. 5.

In this embodiment example, the modes of the frequency comb 15 are directly whole number proportional to the frequency afforded by a suitable fixed frequency divider 14. Such a frequency comb 15 is commercially available. In the embodiment example in FIG. 5, the frequency of oscillator 7 is directed through the frequency divider 14 to the frequency comb 15 and sets the tooth spacing between the comb modes there. A part of the laser light is now guided by the beam splitter optics 5 to a photodiode 16, at which light from frequency comb 15 also arrives. Beat frequencies arise here due to the mixing of the optical frequencies from frequency comb 15 and laser 4. One of these beats can be isolated by means of a suitable filter. At a frequency comparator 17a (usually a phase regulator loop), said beat frequency can be compared to that of the stabilized oscillator 7. For this, the frequency of the stabilized oscillator 7 in general must again be adjusted by a fixed additional frequency multiplier 17 to the beat frequency. The resulting deviation signal can—as in the previous embodiment example of FIG. 4—be directed to a heating current source 12 in order to stabilize the length of the resonator 3a with high accuracy.

Figure 6:
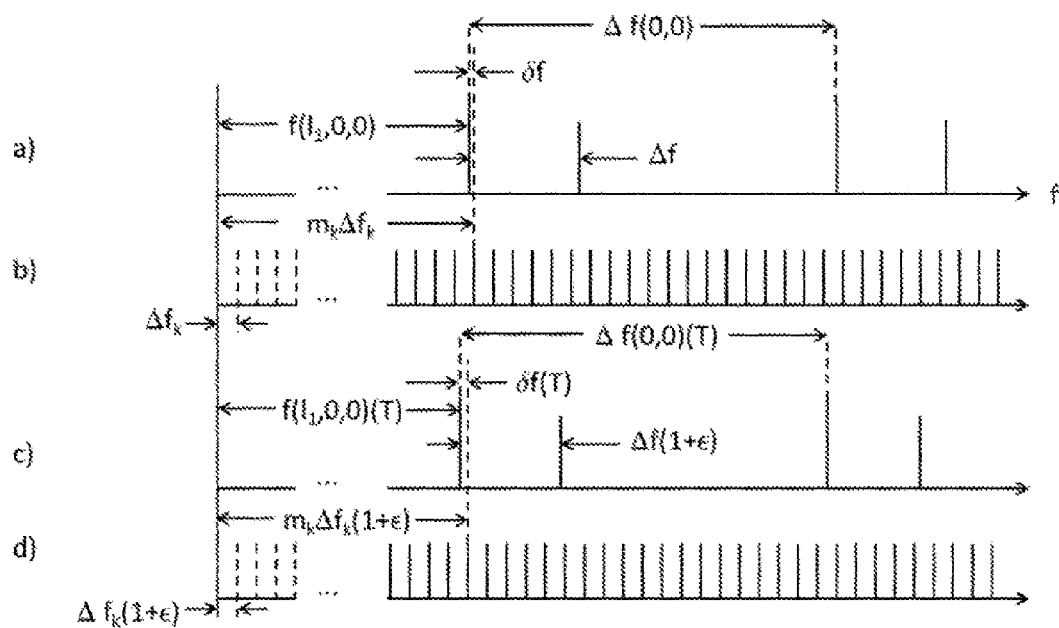
FIGS. 6a) through d) show schematic representations of the relevant frequencies for the application in FIG. 5.

The effect of a temperature change is shown in FIG. 6. Here, the lines a) and b) show the modes of the optical resonator 3a at the set temperature, while the effect of the temperature change is represented in lines c) and d). A temperature change changes the optical frequency f1 of the transversal ground mode, f(l1, 0, 0)→f(l1, 0, 0)(T), the frequency difference from this mode to the next transversal ground mode, Δf(0,0)→Δf(0, 0)(T), and also the reference frequency Δf→Δf×(1+ε). However, the relative change of the reference frequency ε is considerably smaller than the relative change of the two other said frequencies. For the application in FIG. 4, this means that while the temperature has little effect on the reference frequency Δf, it has a clearly measurable effect on the ratio of the two frequencies, in other words $$1 + \epsilon \cong 1, \text{ but } \left| \frac{\Delta f(0, 0)}{\Delta f} - \frac{\Delta f(0, 0)(T)}{\Delta f(1 + \epsilon)} \right| \gg 0.$$

Figure 5:
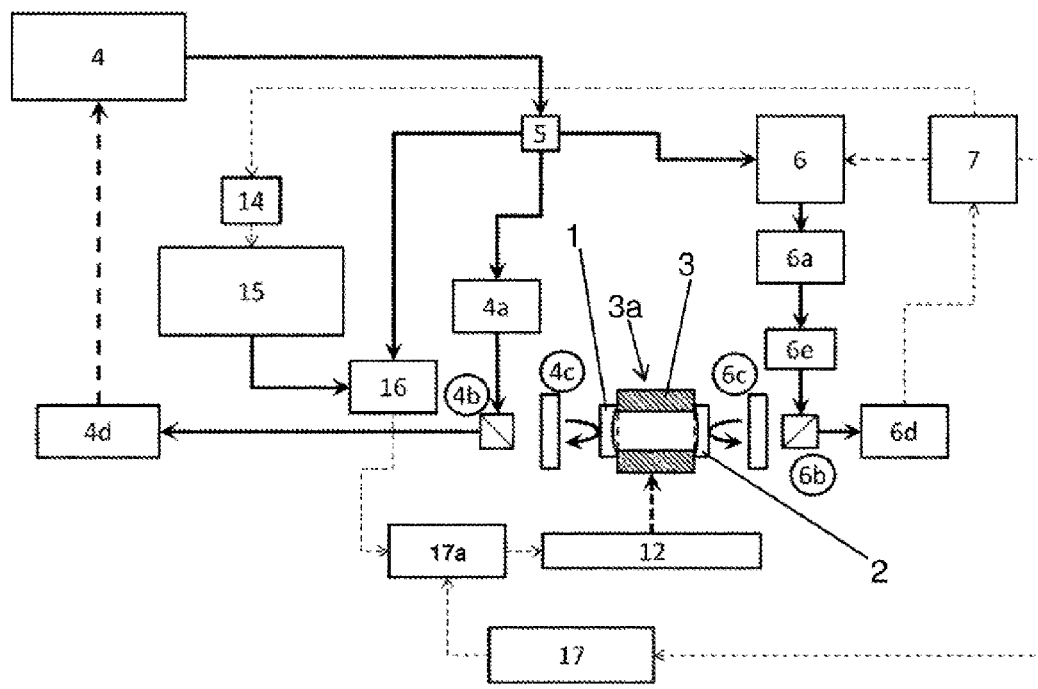
FIG. 5 shows a schematic representation of another embodiment of the device according to the invention, in which the length of the resonator is stabilized by means of the temperature at the difference between the optical frequency of one mode of the resonator and a mode of a frequency comb, wherein the tooth spacing in the frequency comb is determined by the reference frequency.

In the application in FIG. 5, the change of the reference figure is transferred multiplicatively to the tooth spacing of the frequency comb 15. The original comparison mode of the frequency comb 15 with comb mode index $m_k$ and mode spacing $\Delta f_k$ has a frequency $m_k \times \Delta f_k$ and is shifted to the frequency $m_k \times \Delta f_k \times (1+\epsilon)$ by a change of temperature or length. The original spacing of the selected transversal ground mode of the resonator 3a to the nearest comb mode δf=f(l1, 0, 0)−$m_k \times \Delta f_k$ thus changes to δf(T)=f(l1, 0, 0)(T)−$m_k \times \Delta f_k \times (1 \times \epsilon)$. Here, too, the reference frequency remains close to its original value, while a measurable shift of the frequency spacing |δf(T)−δf|≫0 can arise.

That is, f1 is given by the frequency of the mode m1 to which the laser 4 is adjusted; f2 is given by the frequency of a higher transversal mode m2, to which the frequency of the laser 4, in addition to the frequency of the acousto-optical frequency shifter 6, is adjusted; f3 is the frequency of the comb mode in the vicinity of f1, given by $m_k \times \Delta f_k$; f4 is the frequency difference f3−f1.

The self regulation strategies will now be explained further by means of a numerical example.

The accuracy of the stabilization is dependent on the frequency resolution capacity of the system. Generally, the resonance frequency of a mode in an optical resonator 3a can be determined with an accuracy of $$\sigma_f = \frac{c}{2L}\frac{1}{4F}\sqrt{\frac{\hbar c}{\lambda P}}\frac{1}{\sqrt{t}}.$$

Here, t is the measurement time, ℏ is the reduced Planck constant, λ is the wavelength, and P is the optical power. F specifies the finesse of the resonator, which is given by the quality of the mirrors.

Realistic values of these parameters are P=100 μW and F=100,000. A higher optical power can indeed improve the frequency resolution, but if the values are too large, it leads to heating of the mirrors due to absorption. Said effect is negligible at 100 μW. For the following numerical examples, the value λ=1.55 μm is selected, since this is a common wavelength in optical telecommunications. It is additionally assumed that the resonator—as in Reference 3 [Hagemann, C., et al.; "Ultrastable laser with average fractional frequency drift rate below $5 \times 10^{-19}$/s"; Optics Letters (39) 17, 5102-5105 (2014)]—has a length of L=21 cm. For a measurement duration of one second, a frequency resolution of $\sigma_f$(min)=0.064 mHz can thus be achieved. The resolution for the difference between two frequencies can then be estimated with $\delta f$(min)=$\sigma_f$(min)×√2=0.09 mHz.

In the embodiment example of FIG. 5, the mount 3 is made, for example, of aluminum, with a linear coefficient of expansion of 23 ppm/K, while the mirrors 1, 2 are made, for example, of ULE® glass. Resonator 3a is at the zero-crossing temperature of the linear coefficient of expansion of the mirrors (~22° C.) and in a vacuum. The mirrors 1, 2 have the radii of curvature described above, R2=ΦR1 and R1=L/$L_{opt}$. If the method in FIG. 4 is employed and l2−l1=1 is valid, then there will be a frequency difference of Δf(0,0)=714 MHz between two adjacent longitudinal ground modes, while the difference between the first longitudinal ground mode and the second transversal mode will be Δf=464 MHz. Thus, the combined frequency resolution corresponds to a temperature change of about 10 nK. This in turn corresponds to a relative frequency change of the reference frequency of $2 \times 10^{-25}$ per second, which is less than the current best mark of Reference 3 by 6 orders of magnitude. The relative change of length of the resonator 3 in this example is $2.3 \times 10^{-13}$, and this value is 3 orders of magnitude higher than the current smallest thermal fluctuations of length from Reference 3.

In this regard, one should also note the following: If the value of $10^{-16}$ from Reference 3 is assumed as the smallest possible value for thermal length fluctuations, then the frequency shift corresponding to such a change of length, which is measured by the method in FIG. 5 with frequency comb stabilization, is still 19.5 mHz. The change would therefore be solvable with the assumed values and thus regulatable. In this case, the relative change of the reference frequency would be less than $10^{-31}$. It should also be stressed at this point that long-term shifts, as described in Reference 3, are suppressed to the greatest possible extent by the proposed self-correction.

Figure 7:
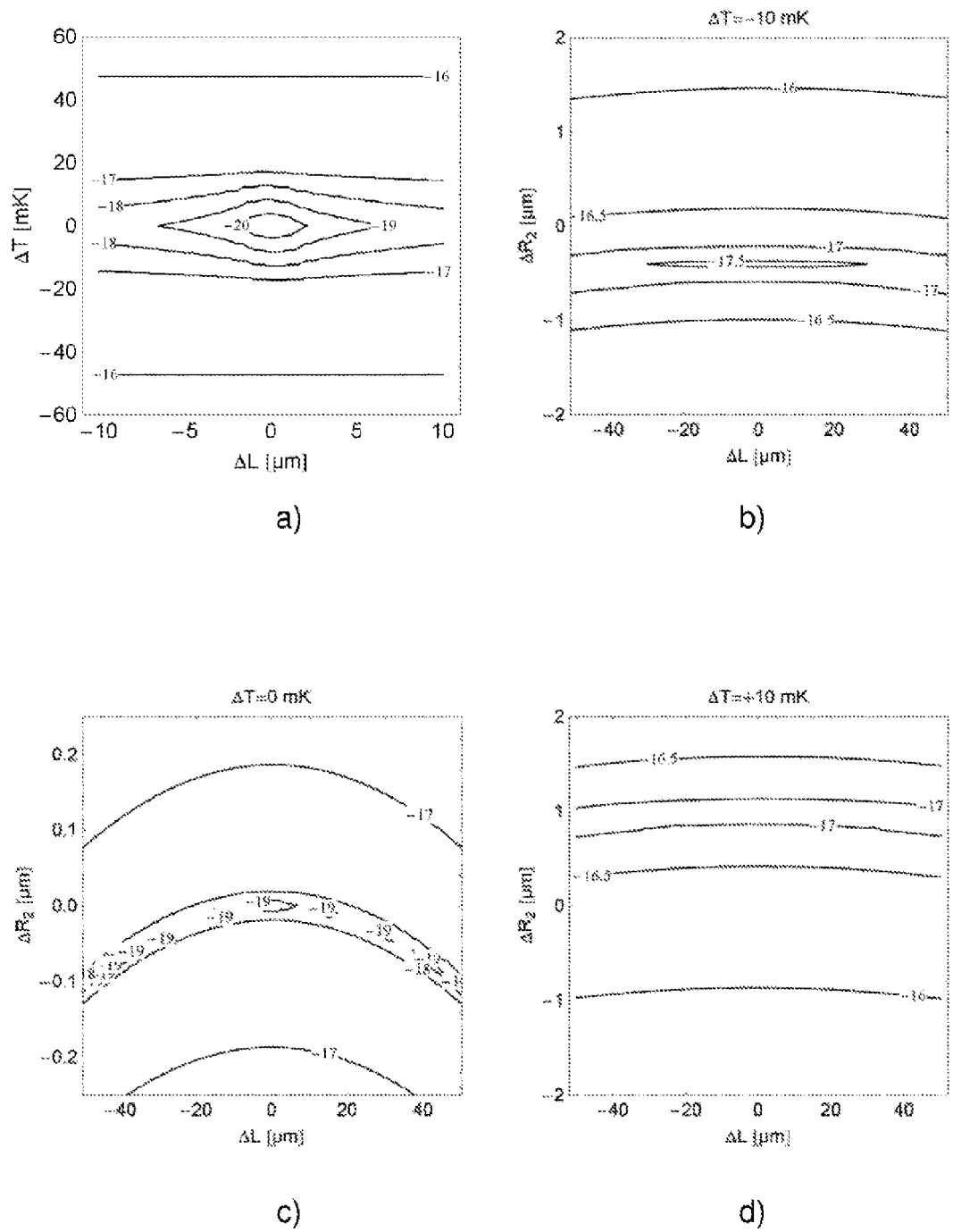
FIGS. 7a) through d) show the effect of deviations of resonator properties from their ideal values.

The calculations presented above start from optimum values. The illustrations in FIG. 7 show the effect of deviations from the optimum parameters. Large variations of 1 μK in the temperature and 1 μm in the length of resonator 3a are assumed in order to illustrate their effects. The curves show the order of magnitude of the absolute value of the average relative deviation of Δf that results from these variations of length and temperature. Not all curves are shown. FIG. 7*a*) shows the effect of deviations of the temperature (ΔT) and the length (ΔL) from their ideal values around the operating point. Here, one can see that the assumed variation at the ideal values have a very small effect. The effect increases if there are deviations from the ideal values, but for increasing temperature deviations, the importance of length deviations becomes increasingly smaller.

FIGS. 7*b*), *c*) and *d*) show the effect of deviations in length and radius of curvature of a mirror for three different temperature deviations. Here again, one can see that small deviations of length have a small effect, but the system is relatively sensitive to deviations in radius of curvature. Nevertheless, even a nonideal resonator 3a can be made variation-robust by an adjustment of the temperature. For comparison, for said variation ranges, the frequency of the optical mode of a resonator 3a that is made entirely of ULE® glass exhibits values on the order of magnitude of $10^{-21}$ due to temperature variation and $10^{-13}$ due to length variations.

Of course, the methods for self-stabilization can also be used for nonideal optical resonators, but the reference frequency Δf will not exhibit the best possible stability.

Finally, embodiment examples that can easily be integrated into microsystems that are suitable for mass production will now be presented. Modern communications and data processing systems increasingly contain photonic components, which consist of optical waveguides on chips. An optical waveguide is in general a structure that consists of a core with a higher refractive index than the medium surrounding it. As a result, light has propagating modes in the waveguide that can be roughly understood via an image of the total internal reflection. Meanwhile, a large number of chip-integrated laser sources, modulators, and detectors have been developed. With these components, chip-based optical resonators can be used as frequency references in a fully integrated photonic system, or a stable reference frequency Δf can be produced in this way in accordance with the invention.

There are various types of chip-based resonators. For example, it is also possible to modify the methods described above for waveguide geometries with integrated Bragg mirrors, so that in the end, a resonator that corresponds to the Fabry-Pérot type is produced. Another possible type of waveguide resonator is the whispering gallery mode resonator, also called a ring resonator, which is very attractive for use, since it can have very high Q factors, see, for example, Reference 4 [D. T. Spencer, J. F. Bauters, M. J. R. Heck, and J. E. Bowers; "Integrated waveguide coupled Si3N4 resonators in the ultrahigh-Q regime"; Optica, Vol. 1, No. 3, p. 153, September 20, (2014)]. This type of resonator in general consists of a closed waveguide, which can, for example, be circular, elliptical, or stadium-shaped, but in principle can take any closed form. For the sake of simplicity, round resonators are assumed in the following embodiment examples, but the description is applicable to any desired geometry by replacing the resonator length.

Light is guided into and out of the ring resonators by evanescent coupling. The resonance frequencies can be calculated via the extent and the effective refractive index of the propagating modes. However, there are no analytical methods to calculate the mode spectrum for these systems. For this reason, numerical minimizing methods must be employed. Nevertheless, even here ranges can be found for which the frequency difference between two modes is minimally dependent on the temperature.

The light modes of a waveguide have a portion in the medium surrounding the core, and said portion is mode-dependent. The fact that even here stable mode pairs can exist thus stems from the fact that different modes thereby have different effective refractive indices, which also have different temperature dependences. Thus, mode pairs for which the change of the resonance frequencies is nearly identical for small operating parameter variations, in particular temperature variations, can also be produced here.

The mode pairs can be produced in a number of waveguide arrangements. For example, all three required modes can be produced in a single ring resonator (not shown). Alternatively, the modes can be situated in three different resonators 24, 25, 26, through which greater freedoms in determining the mode properties result, see FIG. 8. Another variation is the production of a pair 35 of ring resonators that are coupled to each other, see FIG. 9. Through the coupling, a mode pair is produced whose frequency spacing can be finely determined by the fabrication parameters (radii and spacing between the rings), see, for example, Reference 5 [Zhang, Z., Dainese, M., Wosinski, L., & Qiu, M.; "Resonance-splitting and enhanced notch depth in SOI ring resonators with mutual mode coupling"; Optics Express, 16(7), 4621-4630 (2008)].

The resonance frequency in a circular cavity resonator is given by $$f_r(T) = \frac{mc}{2\pi rn(1+\beta T)} \sim \frac{mc}{2\pi rn}(1-\beta T).$$

Here, m is the number of wavelengths in the resonator, n is the refractive index, and $\beta$ is the linear temperature coefficient. Quantity T again gives the deviation of the temperature from the desired set value or the operating point temperature. Small temperature changes are assumed, so that quadratic deviations can be neglected. The temperature coefficient $\beta$ then describes all effects that influence the propagation of the modes. These are, for example, thermal expansion, which affects the radius r of the ring and the dimensions of the waveguide, and the thermal dependence of the refractive index n of the core and jacket. In general, the dimensional dependence for all modes will be the same, but the change of the refractive index n for each mode is different. Thus, a slightly different coefficient $\beta$ results for each mode. The frequency difference between two modes is then given by $$\Delta f_r(T) = \frac{c}{2\pi}\left(\frac{m_2(1-\beta_2 T)}{r_2 n_2} - \frac{m_1(1-\beta_1 T)}{r_1 n_1}\right),$$

wherein the subscripts 1 and 2 represent the relevant mode. The zero crossing of the first derivative with the condition $m_2\beta_2 r_1 n_1 = m_1\beta_1 r_2 n_2$ is found via the above expression. The required ratio between mode indexes, radii, and refractive indexes, as well as their thermal dependences can be found via these two expressions. Detailed tests showed that this condition can be relaxed somewhat in order to achieve satisfactory results, namely to the design condition $m_1 * \beta_1 * L_2 * n_2 = m_2 * \beta_2 * L_1 * n_1 \pm 0.1\%$.

The relationship between mode indexes and radii is limited by the light frequency, which, for example, for telecommunications applications, lies in the range around 195 THz. In addition, for a given waveguide technology, one must keep in mind the dependence of the losses on resonator radius, so that the choice of the radii can be limited. This is because waveguides have endless transmission. The longer the waveguide, the more light goes lost. Conversely, small ring radii also lead to losses because of the greater curvature. Because of this, there is a range of a particularly useful radii.

Moreover, both the refractive indices $n_1$, $n_2$ and the thermal coefficients $\beta_1$, $\beta_2$ are dependent on the waveguide dimensions and therefore need to be optimized together to the target value. In principle, a desired frequency difference and an appropriate size reduction can therefore be chosen for the radii $r_1$, $r_2$. Together with the achievable range of the refractive indices $n_1$, $n_2$, this results in boundaries for the selectable mode indices. Accordingly, the refractive indices $n_1$, $n_2$ and temperature coefficients $\beta_1$, $\beta_2$ can be selected for the desired frequency difference $\Delta f$. For example, it can be seen from Reference 4 that differences in the refractive index between ~0% and ~0.15% are absolutely achievable by means of dimensioning the waveguide. The largest corresponding difference between the temperature dependences of the two modes can be calculated to be ~0.8%. For modes in a single ring ($r_1=r_2$), stable mode pairs with a smallest frequency distance of ~11 GHz at a radius of 5 mm result from this. The frequency difference can be finely adjusted via the radius. In the case of two different rings, the frequency difference can be more finely and more freely adjusted via the different radii. The stable frequency is extremely sensitive to the radii of the rings both for one and for two rings. Thus, a deviation in radius by 0.002 percent (0.02 per mil) can give rise to a deviation of up to two percent in the frequency. Therefore, in practice, the manufacturing process must be adjusted very precisely to a starting frequency. However, in the electronics sphere, frequency conversion is routine and therefore a known frequency deviation can at least be corrected here and the stability can nevertheless be used. Moreover, for many applications, a stable, accurately known frequency is sufficient.

Because the mode indices are whole numbers, the above described design condition will not be exactly satisfied in practice, since the dimensions, refractive indices, and thermal dependences are subject to certain manufacturing variations. Two effects that have been neglected up to now can be used to still produce a zero crossing of the temperature dependence: First, the modes are subject to different dispersion relations, so that the refractive indices (at constant temperature) can be nicely modified, even though in steps, through the choice of the mode indices $m_1$ and $m_2$. Second, the modes are also subject to higher order thermal coefficients, so that the values $\beta_1$ and $\beta_2$ can be finely set by changing the operating point temperature.

Another variation for producing a stable mode pair is the coupling of two modes. Said coupling can be produced in a single ring by a reflecting element or can be produced via evanescent coupling of two rings (see Reference 5).

In a single ring, the variants of a three-dimensional mode, which propagate clockwise and counterclockwise in the ring, are coupled through this. Since the three-dimensional modes are nominally identical, their thermal coefficients will also be nearly the same, so that a high stability can be expected. The strength of the coupling, which in this case is exactly the reference frequency Δf, can be determined via the reflectivity. However, a single reflecting element (as used in Reference 5) will in general lead to scattering losses, since it causes a non-adiabatic change of the mode parameters and thus a scattering into free modes in the jacket.

These losses can be largely avoided through the use of two rings, since the coupling can arise by means of evanescence between the modes of the rings, so that the propagation parameters only change slowly along the rings. This application variant is well suited for stable frequencies Δf in the range around 250 MHz. This value results from the fact that the line widths of good ring resonators with diameters around 1 cm lie in the range of 10 MHz, while the spacing between modes with said dimensioning is 6.5 GHz (Reference 4). The stable frequency difference Δf is thus clearly larger than the line width, so that the modes can be easily resolved. On the other hand, it is clearly smaller than the mode spacing in one ring, so that the overlap with the next mode is vanishingly small. The strength of coupling between the rings is exponentially dependent on the minimum spacing of the rings (which do not have to be concentric), and thus can be selected. At the point where the modes of the two individual rings have the same frequency $f_0$, two modes, which are split by the coupling 2 g, arise due to the coupling. The frequency spacing $\Delta f_K(T)$ between the two modes for rings with thermal coefficients $\beta_1$ and $\beta_2$ is given by $$\Delta f_g(T) = 2g\sqrt{1 + \left(f_0 \frac{\beta_1 - \beta_2}{2g} T\right)^2} \cong 2g + \frac{1}{4g}((\beta_1 - \beta_2)f_0 T)^2,$$

which is thus temperature-insensitive to resonance up to a first order of magnitude. Several small corrections were neglected here, for example a small shift of temperature $$\left(\sim \left(\frac{2g}{f_0}\right)^2 \frac{\sqrt{\beta_1 \beta_2}}{(\beta_1 - \beta_2)^2}\right),$$

which for the parameters used here is much smaller than 1 Kelvin, as well as a further shift due to the final width and asymmetry of the resonance lines, and a shift due to a small temperature dependence of the strength of coupling. In practice, these shifts must be determined by measurement. Moreover, in general, the resonance frequencies of the two rings will not be identical at the desired operating point temperature. Through the difference in the thermal coefficients $\beta_1$ and $\beta_2$, the rings can, however, be brought into resonance. However, since the quadratic term of the temperature dependence is also dependent on said difference, the sensitivity can be reconciled against the susceptibility to detuning. For example, for a difference of the temperature coefficients of 0.2%, a thermal tuning of about ±15 K is necessary to achieve the resonance condition. Nonetheless, this variant can then be used to produce a stable reference frequency and another mode of the system, or a third ring can serve as temperature-dependent element for long-term stabilization according to the invention. It should be noted at this point that the same effect can also be achieved with coupled Fabry-Pérot resonators.

Figure 8:
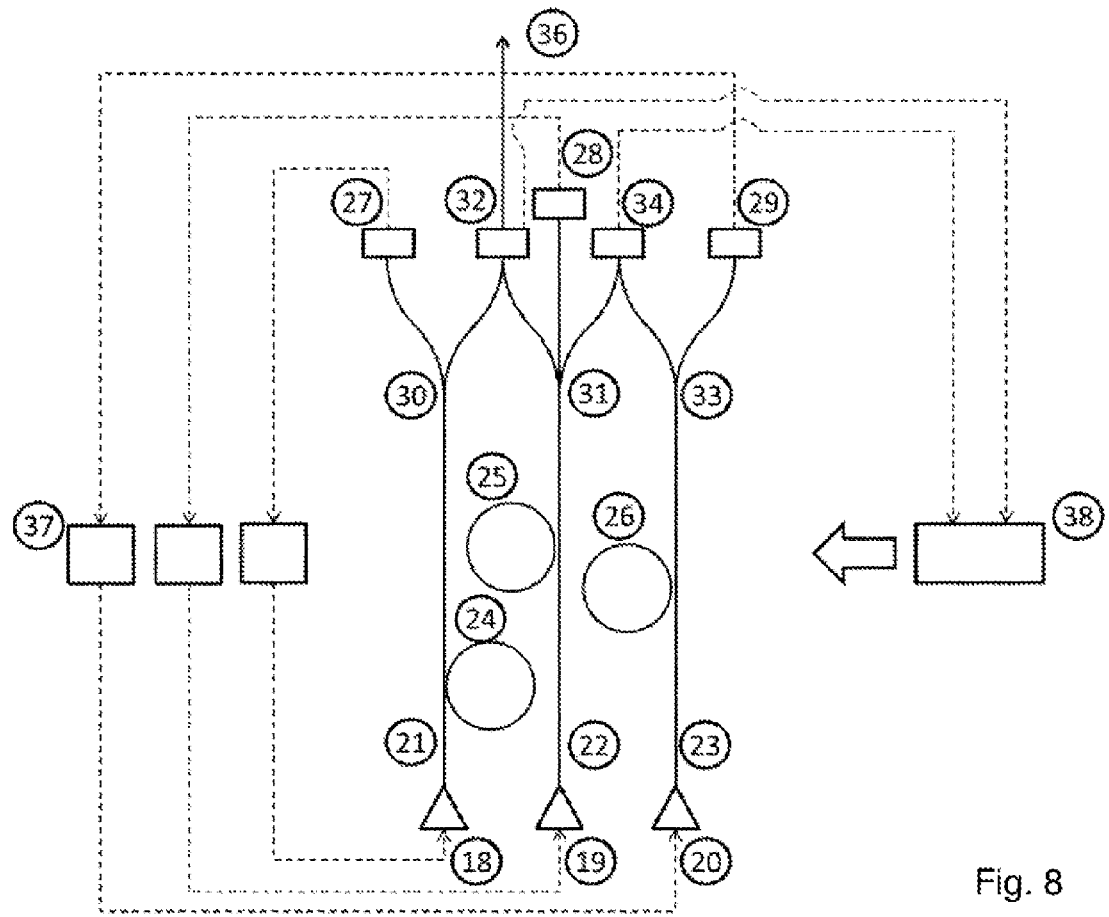
FIG. 8 shows another embodiment of the device according to the invention, wherein three ring resonators are used.

A variant with three different resonators is shown in FIG. 8. Here, the light from three different modulated laser light sources—a first source 18 to produce light of frequency f1, a second source 19 to produce light of frequency f2 and a third source 20 to produce light of frequency f3—is guided in three waveguides—a first waveguide 21, a second waveguide 22, and a third waveguide 23. The modes of these waveguides overlap slightly with those of three ring resonators—a first ring resonator 24, a second ring resonator 25, and a third ring resonator 26—and in this way couple evanescent light in their selected resonance modes. The transmitted light is collected by the relevant detectors—a first detector 27, a second detector 28, and a third detector 29. Here, too, the frequency of each laser 18, 19, 20 can be kept at the desired resonance in the relevant ring 24, 25, 26 by means of the side bands produced by the modulation, so that the frequencies f1, f2, f3 are stabilized. Again the Pound-Drever-Hall technique (Reference 6) is used for this. The modulation of the lasers 18, 19, 20, the demodulation of the detector signals, and the regulation of the laser beam are carried out in the integrated electronic modules 37. The deviation of the laser frequency from the resonant mode frequency, which can be seen from the demodulation, is carried out by a correction of the laser beam for each laser light source 18, 19, 20 individually.

Moreover, the light from the laser light sources 18 and 19 is guided by means of integrated beam splitters—a first beam splitter 30 and a second beam splitter 31—to another, fourth detector 32, at which the beat frequency Δf between the two mode frequencies f1, f2 in rings 24 and 25 is measured. The same technique can be used for the laser light sources 19 and 20 via the second beam splitter 31 and a third beam splitter 33 in order to measure, at a fifth detector 34, the beat f4 between the mode frequencies f2 and f3 of rings 25 and 26.

Because of the described design of the resonators 24, 25, the beat frequency Δf at the fourth detector 32 is highly stable, while the beat frequency f4 at detector 34 is sensitive to disruptions. A part of the light, which carries the stable beat frequency Δf, can be sent on to an optical output 36 as an optical signal of the chip and can be distributed via optical fibers or as a free beam to other devices.

Moreover, the measured beat frequency can, just like in the preceding description, serve for self-stabilization of the device or the reference frequency Δf: The beat frequencies Δf and f4 from detectors 32 and 34 can again be compared at an electronic unit 38, and changes of preset values can be used for regulation of a heating current source. Thus, the temperature of the chip and thus the clock frequency can be precisely stabilized.

Preferably, this needs to take place considerably slower than the correction of the laser beams. In practice, this condition is easily satisfied, since the thermal regulation at best can take place on a millisecond scale, while the laser beam can be corrected in less than one microsecond.

Figure 9:
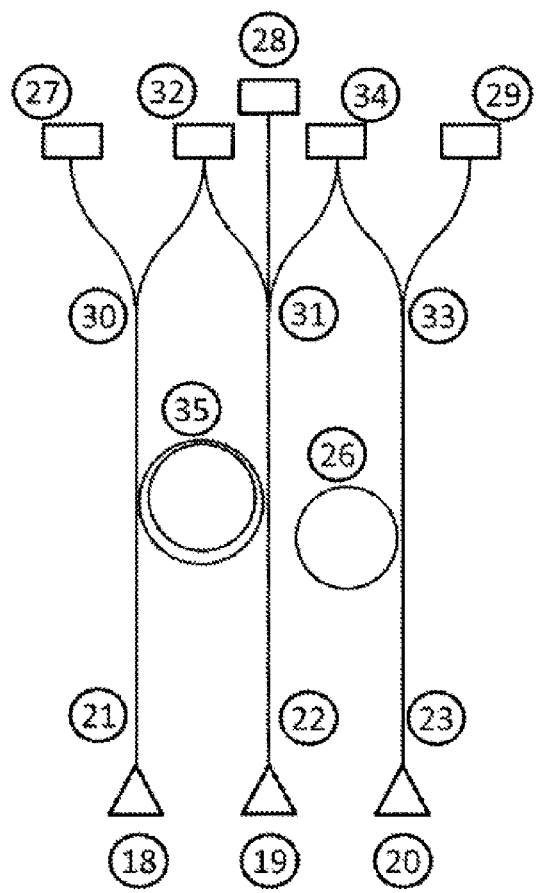
FIG. 9 shows another embodiment of the device according to the invention, analogous to FIG. 8, but where the first and the second ring resonators are coupled.
Figure 10A:
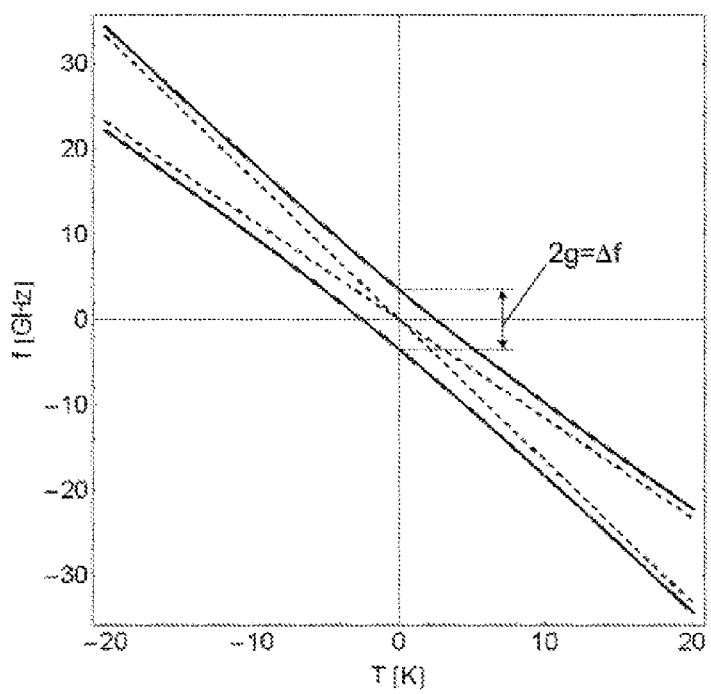
FIG. 10a shows a diagrammatic illustration of the frequencies of the modes of the individual ring resonators in FIG. 8 and the coupled ring resonators in FIG. 9 as a function of the temperature (given with respect to a working point temperature)
Figure 10B:
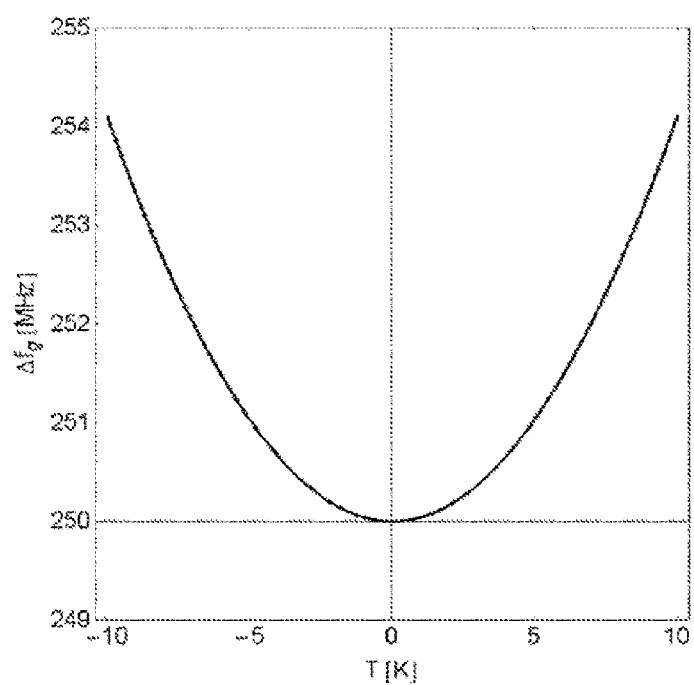
FIG. 10b shows a diagrammatic illustration of the reference frequency in the case of the coupled ring resonators in FIG. 9 as a function of the temperature (given with respect to an operating point temperature).

Last, a variant with coupled resonators is shown in FIG. 9. All elements keep their function as in FIG. 8 up to rings 25 and 26, which are replaced by the coupled ring resonator pair 35. In this drawing, the laser modulation and regulation loops, as well as the temperature regulation, were left out for clarity, but they likewise have the same functions here as in FIG. 8. The modes from the sources 18 and 19 couple via the waveguides 21 and 22 here, each to a mode of the stable mode pair in ring resonator pair 35. FIGS. 10a and 10b serve to illustrate this.

FIG. 10a shows the crossing between two modes of the coupled ring resonator pair 35. The dashed lines represent the frequencies of the modes of the individual resonators of the ring resonator pair 35, while the solid lines show the frequencies of the modes of the coupled system. Through the different thermal coefficients, the frequencies of the individual rings intersect. The coupling leads the resonance to be nearly parallel to the frequencies of the coupled system.

FIG. 10b shows the course of the frequency difference $\Delta f_g(T)$ for a difference of 0.2% between the thermal coefficients and a coupling frequency of 2 g=250 MHz. It should be noted here that the chip-integrated resonator, of course, is also suitable for the frequency comb-based stabilization (described by means of FIGS. 5 and 6), and thus can be used for integrated stabilization of chip-based frequency combs.

The preceding descriptions always started from basically unstable light sources. If a light source with low frequency variations about a frequency f1 is available, the principle of the invention can also be used to carry said stability to the difference frequency f2−f1. In doing so, the variations of the light source frequency are additionally suppressed by the lower (for example, quadratic or cubic) dependence of the frequency difference.

In conclusion, the following should be quite generally noted for material choice: Usually, silicon oxide, titanium oxide, silicon or silicon nitride are used as materials for waveguide systems at wavelengths $\lambda \approx 1.5$ μm. Any material that is transparent in the desired wavelength range and that can be milled and polished in the correct shape (or otherwise produced in the correct shape), can be used as the mirror substrate. Quartz glass and silicon are useful for the indicated 1.5 μm wavelength. Metals, crystals (for example silicon or quartz glass) or ceramics can be used as the mount (see mount 3 in FIG. 1).

REFERENCE NUMBER LIST

1 First mirror
2 Second mirror
3 Mount
3a Fabry-Pérot resonator
4 Laser
4a Electro-optical modulator
4b Polarizing beam splitter
4c Quarterwave retardation optics
4d Demodulator
5 Beam splitter
6 Acousto-optical frequency shifter
6a Second electro-optical modulator
6b Second polarizing beam splitter
6c Second quarter-wave retardation optics
6d Second demodulator
6e Structured phase plate
7 Oscillator
8 Temperature regulator
9 Frequency multiplier
10 Additional acousto-optical modulator
10a Additional electro-optical modulator
10d Third demodulator
11 Optical circulator
12 Heating current source
13 Additional polarization optics
14 Frequency divider
15 Frequency comb
16 Photodiode
17 Additional frequency multiplier
17a Frequency comparator
18 First laser light source
19 Second laser light source
20 Third laser light source
21 First waveguide
22 Second waveguide
23 Third waveguide
24 First ring resonator
25 Second ring resonator
26 Third ring resonator
27 First detector
28 Second detector
29 Third detector
30 First beam splitter
31 Second beam splitter
32 Beam detector
33 Third beam splitter
34 Fifth detector
35 Coupled ring resonator pair
36 Optical output
37 Electronic module
38 Electronic unit

The invention claimed is:

1. A method for producing a reference frequency $\Delta f$ using a first optical resonator and a second optical resonator,
wherein the first resonator has a first resonator mode with a first frequency f1 and the second resonator has a second resonator mode with a second frequency f2, wherein the frequencies of the two resonator modes are functions of an operating parameter BP, and take the values f1 and f2 at a set value $BP_0$ of the operating parameter, so that f1 $(BP_0)$=f1 and f2$(BP_0)$=f2,
wherein the resonators are designed so that the first derivative of the frequencies f1 (BP), f2(BP) with respect to BP, or at least a difference ratio around $BP_0$, corresponds up to a deviation of a maximum of ±0.1%,
wherein light of the first frequency f1 is stabilized at the first frequency f1 by the first resonator, and light of the second frequency f2 is stabilized at the second frequency f2 by the second resonator,
and wherein the difference between the stabilized frequencies f1 and f2, $\Delta f=|f1-f2|$, is determined in order to obtain the stabilized reference frequency $\Delta f$.

2. The method as in claim 1, wherein the first optical resonator has a resonator length $L_1$ and a linear temperature coefficient $\beta_1$ and the second optical resonator has a resonator length $L_2$ and a linear temperature coefficient $\beta_2$, wherein the resonators are designed so that $m_1*\beta_2*n_2=m_2*\beta_2*L_1*n_1$ up to a deviation of a maximum of ±0.1%, with $m_1$, $m_2$ being whole numbers, which correspond to the wavelength numbers of the first or second resonator mode in the first or second resonator, and $n_1$, $n_2$ correspond to the refractive indices for the first resonator mode in the first resonator and the second resonator mode in the second resonator,
or that coupled modes are present in the first and second resonator, and a mode spectrum that is split because of the coupling contains the first resonator mode and the second resonator mode.

3. The method as in claim 1, wherein the first resonator simultaneously also forms the second resonator and is identical to it.

4. The method as in claim 3, wherein the mode coupling is produced by an at least partially reflecting element.

5. The method as in claim 1, wherein the mode coupling is produced by evanescent coupling of the first resonator to the second resonator.

6. The method as in claim 1, wherein the two resonator modes can each be described by a longitudinal index and two transversal indices, wherein the first resonator mode and the second resonator mode have the same longitudinal index and at least one different transversal index.

7. The method as in claim 1, wherein light of a third frequency f3 is produced and is stabilized by means of a resonator, wherein f3 has a greater dependence on the operating parameter than $\Delta f$, that a comparison frequency f4 is given by $$f4=|f3-f1| \text{ or } f4=|f3-f2|$$

and that the ratio $f4/\Delta f$ or the difference $f4-\Delta f$ is determined and is used to control operating parameter regulating means, which are provided to regulate the operating parameter of the first resonator and/or second resonator.

8. The method as in claim 7, wherein the first resonator and/or the second resonator or a third resonator is used to stabilize the light of the third frequency f3.

9. The method as in claim 7, wherein the light of the third frequency f3 is formed by a comb mode of a frequency comb.

10. The method as in claim 1, wherein a Fabry-Perot resonator is used as the first resonator and/or second resonator.

11. The method as in claim 1, wherein an optical ring resonator is used as first resonator and/or as second resonator.

12. The method as in claim 1, wherein an optical resonator made as a waveguide on an optical chip is used as first resonator and/or as second resonator.

13. A device for production of a reference frequency $\Delta f$, wherein a first optical resonator, which has a first resonator mode with a first frequency f1, and a second optical resonator, which has a second resonator mode with a second frequency f2, are provided, wherein the frequencies of the two resonator modes are functions of an operating parameter BP, and take on the values f1 and f2 at a set value $BP_0$ of the operating parameter, so that $f1(BP_0)=f1$ and $f2(BP_0)=f2$, wherein the resonators are designed so that the first derivative of the frequencies f1(BP), f2(BP) with respect to BP, or at east one difference ratio around $BP_0$, corresponds up to a deviation of a maximum of $\pm 0.1\%$, the device further comprising first light producing means to produce light of the first frequency f1 and second light producing means to produce light of the second frequency f2, wherein the first light producing means and the second light producing means comprise at least one laser, the device further comprising first stabilization means, to stabilize the first frequency f1, and second stabilization means to stabilize the second frequency f2, wherein determination means are provided in order to determine the difference between the stabilized frequencies f1 and f2, $\Delta f=|f1-f2|$, and to maintain the stabilized reference frequency $\Delta f$.

14. The device as in claim 13, wherein the first optical resonator has a resonator length $L_1$ and a linear temperature coefficient $\beta_1$ and the second optical resonator has a resonator length $L_2$ and a linear temperature coefficient $\beta_2$, wherein the resonators are designed so that $m_1 * \beta_1 * L_2 * n_2 = m_2 * \beta_2 * L_1 * n_1$ up to a deviation of a maximum of $\pm 0.1\%$, with $m_1$, $m_2$ being whole numbers, which correspond to the wavelength number of the first or second resonator mode in the first or second resonator, and $n_1$, $n_2$ correspond to the refractive indices for the first resonator mode in the first resonator and the second resonator mode in the second resonator, or that coupled modes are present in the first and second resonator, and a mode spectrum that is split because of the coupling contains the first resonator mode and the second resonator mode.

15. The device as in claim 13, wherein the first stabilization means comprises first modulation means to modulate side bands on the light of the first frequency f1, and first demodulation means with a first detector to produce a first error signal by means of the modulated light of the first frequency f1 that is reflected back or transmitted to the first detector, and first regulating means to regulate, by means of the first error signal, the first light producing means so that the first frequency f1 becomes stabilized, and that the second stabilization means comprises second modulation means to modulate side bands on the light of the second frequency f2, and second demodulation means with a second detector to produce a second error signal by means of the modulated light of the second frequency f2 that is reflected back or transmitted to the second detector, and second regulating means to regulate, by means of the second error signal, the second light producing means so that the second frequency f2 becomes stabilized.

16. The device as in claim 13, wherein the first resonator simultaneously also forms the second resonator and is identical to it.

17. The device as in claim 16, wherein an at least partially reflecting element is provided to produce the mode coupling.

18. The device as in claim 13, wherein the first regulator is evanescently coupled to the second resonator to produce the mode coupling.

19. The device as in claim 13, wherein the two resonator modes can each be described by a longitudinal index and two transversal indices, wherein the first resonator mode and the second resonator mode have the same longitudinal index and at least one different transversal index.

20. The device as in claim 13, wherein third light producing means are provided to produce light of a third frequency f3 along with a resonator for stabilization, wherein f3 has a greater dependence on the operating parameter than $\Delta f$, a comparison frequency f4 is given by $$f4=|f3-f1| \text{ or } f4=|f3-f2|,$$

wherein additional determination means are provided to determine the ratio $f4/\Delta f$ or the difference $f4-\Delta f$, and that the operating parameter regulating means are provided to control the operating parameter of the first resonator and/or of the second resonator as a function of ratio $f4/\Delta f$ or the difference $f4-\Delta f$.

21. The device as in claim 20, wherein the resonator for stabilizing the light of the third frequency f3 is the first resonator and/or the second resonator or a third resonator.

22. The device as in claim 20, wherein the third light producing means comprises a frequency comb to form the light of the third frequency f3 as a comb mode of the frequency comb.

23. The device as in claim 13, wherein the first resonator and/or the second resonator is a Fabry-Perot resonator.

24. The device as in claim 13, wherein the first resonator and/or the second resonator is an optical ring resonator.

25. The device as in claim 13, wherein the first resonator and/or the second resonator is made as a waveguide on an optical chip.

26. The method of claim 1 wherein the operating parameter comprises a temperature.

27. The method of claim 7 wherein the operating parameter comprises a temperature.

28. The method of claim 7 wherein the operating parameter regulating means comprises a temperature regulating means and the operating parameter comprises a temperature.

29. The device of claim 13 wherein the operating parameter BP comprises a temperature.

30. The device of claim 13 wherein the first and second light producing means together comprise at least one laser.

31. The device as in claim 20 wherein the operating parameter comprises a temperature.

32. The method of claim 20 wherein the operating parameter regulating means comprises a temperature regulating means and the operating parameter comprises a temperature.

* * * * *

UNITED STATES PATENT AND TRADEMARK OFFICE
CERTIFICATE OF CORRECTION

| | |
|---|---|
| PATENT NO. | : 10,558,173 B2 |
| APPLICATION NO. | : 16/091333 |
| DATED | : February 11, 2020 |
| INVENTOR(S) | : Michael Trupke |

Page 1 of 1

It is certified that error appears in the above-identified patent and that said Letters Patent is hereby corrected as shown below:

In the Claims

<u>In Claim 13, Column 23, Line 41</u>:
DELETE "east"
INSERT --least--

<u>In Claim 14, Column 23, Line 61</u>:
DELETE the chemical formula "$*n_2=_2$"
INSERT the chemical formula --$*n_2=m_2$--

<u>In Claim 16, Column 24, Line 26</u>:
DELETE "(simultaneously"
INSERT --simultaneously--

Signed and Sealed this
Second Day of June, 2020

Andrei Iancu
*Director of the United States Patent and Trademark Office*